United States Patent [19]

Cutchaw

[11] 4,063,791
[45] Dec. 20, 1977

[54] CONNECTOR FOR LEADLESS INTEGRATED CIRCUIT PACKAGES

[76] Inventor: John M. Cutchaw, 7333 E. Virginia, Scottsdale, Ariz. 85257

[21] Appl. No.: 754,365

[22] Filed: Dec. 27, 1976

[51] Int. Cl.² .................... H05K 1/12; H01R 13/54
[52] U.S. Cl. ..................... 339/17 CF; 339/75 MP
[58] Field of Search ............ 339/75 M, 75 MP, 17 R, 339/17 CF, 17 LM, 17 M, 88 R, 88 C, 89 R, 89 C, 89 M, 127 R, 127 C; 220/297

[56] References Cited

U.S. PATENT DOCUMENTS

| | | | |
|---|---|---|---|
| 1,803,847 | 5/1931 | Ellis | 220/297 |
| 3,076,577 | 2/1963 | Craig | 220/297 |
| 3,877,064 | 4/1975 | Scheingold et al. | 339/17 CF |
| 3,904,262 | 9/1975 | Cutchaw | 339/75 MP |

OTHER PUBLICATIONS

IBM Technical Disclosure Bulletin, Jensen et al., vol. 12, No. 9, Feb. 1970, pp. 1394, 1395.

*Primary Examiner*—Roy Lake
*Assistant Examiner*—Neil Abrams
*Attorney, Agent, or Firm*—Herbert E. Haynes, Jr.

[57] ABSTRACT

A connector for demountably attaching a leadless integrated circuit package to an electrically interconnecting backpanel includes a base receptacle mounted on the backpanel and having contact means therein which are in contact with the backpanel. The base receptacle is provided with upstanding headed studs and is adapted to receive the circuit package therein with the terminal pads of the package in alignment with the contact means of the base receptacle. A cover having apertured inclined planes formed therein is mounted atop the base receptacle so that lateral movement of the cover relative to the base causes interaction of the studs with the apertured inclined planes to load the terminal pads of the circuit package into conductive contact with the contact means of the base receptacle and to demountably lock the cover in place atop the base.

5 Claims, 6 Drawing Figures

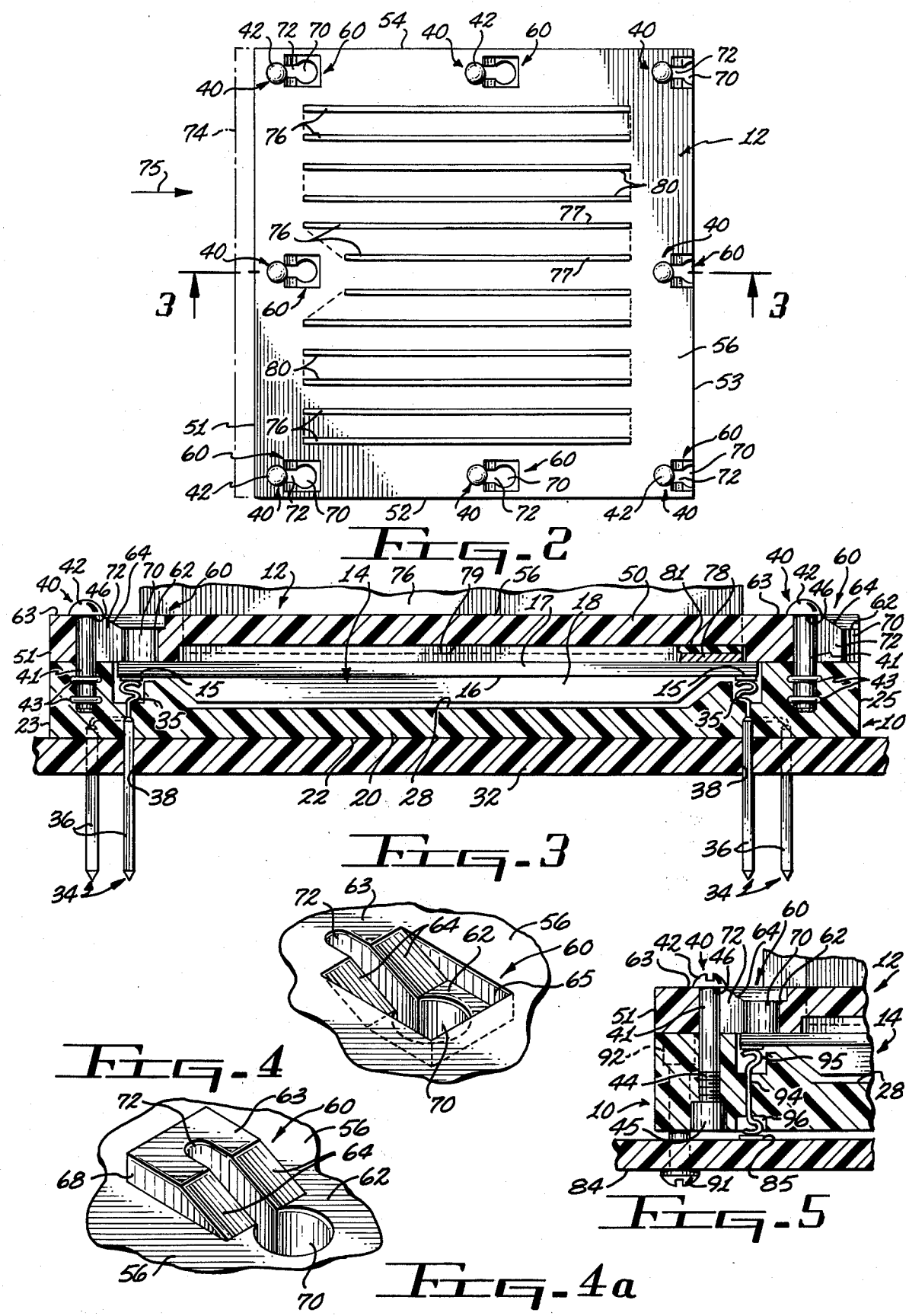

CONNECTOR FOR LEADLESS INTEGRATED CIRCUIT PACKAGES

BACKGROUND OF THE INVENTION

1. Field of the Invention

This invention relates to electrical connectors and more particularly to a connector for leadless integrated circuit packages.

2. Description of the Prior Art

The need for an improved integrated circuit packaging system has become critical, from a profit standpoint, with companies that are trying to use highly developed electronic technology in commercial and consumer applications such as automotive, appliances, communication, industrial components, industrial systems, and the like.

The need stems from the inability of the otherwise excellent dual-in-line package (DIP) to physically meet manufacturing, testing, assembly, and servicing requirements that are being imposed thereon. This problem is due to the leads of the DIP not being strong enough for the manual and mechanical handling that they are receiving as they are being employed in a variety of new products.

This problem with the leads of integrated circuit packages, along with the desire to reduce costs, has led to the development of leadless integrated circuit packages of both the dual-in-line type and what has become known as the 2 × 2 substrate. In place of leads, these leadless packages employ terminal pads located adjacent the edges of a flat ceramic substrate, and the terminal pads are connected to discrete solid state circuits mounted on the substrate. The dual-in-line leadless package is usually rectangular and the terminal pads are located adjacent the opposite longitudinal edges. The 2 × 2 substrate is square and is usually provided with terminal pads adjacent each of its peripheral edges. Specific positioning of the terminal pads is accomplished in three ways which are referred to as: face mount, side mount, and edge mount. The face mount technique places the terminal pads on one face, or planar surface, of the substrate with the pads disposed adjacent to at least two edges. The side mount technique locates the terminal pads on two opposite edges of the substrate so that the pads are disposed in planes which are perpendicular to the planar surfaces of the substrate. The edge mount technique is similar to the commonly employed method used in printed circuit boards in that the pads are located on both planar surfaces of the substrate and are located adjacent the same one edge thereof.

Commercial acceptance of these leadless packages has been relatively slow due to various problems such as connectors for mounting and electrically interconnecting the packages with a backpanel such as a printed circuit board or wiring panel.

Various connector configurations have been employed or suggested for the various leadless connectors, with these prior art connectors being relatively bulky and multipart complex structures. Since the use of terminal pads dictates that a pressure type of interconnection be employed, the forces needed to achieve reliable connections becomes quite large and can become a serious problem when relatively large numbers of interconnections are to be made.

One particular prior art connector employs a base which is mounted on the backpanel by soldering or otherwise attaching the wire wrap pins, which depend from the base, into the backpanel. The leadless package is mounted within a recess provided in the base and the terminal pads of the package are pressurized into conductive contact with upwardly extending portions of the wire wrap pins. The necessary downward pressurization is accomplished by means of a cover hingedly mounted on the base. This, and similar prior art connectors are usually employed only on relatively small leadless packages of the type having terminal pads on only two edges thereof due to the inability of such covers to achieve equal pressurization over long spans and on packages having terminal pads on more than two edges.

Another type of prior art connector employs a base, similar to the one described above, for receiving the leadless package. A force exerting element is placed on the leadless package and is pressurized downwardly by means of a cover which is screwed in place. The screws are located only at the corners or ends of such connectors, as determined by the geometric configuration, so as not to sacrifice valuable contact space. Such a mounting technique complicates servicing and when relatively large leadless packages are mounted in this type of connector, uneven contact pressurization can result in the spans between the mounting screws due to deflection or bowing of the cover and the force exerting element.

A particular prior art connector, which is fully disclosed in U.S. Pat. No. 3,904,262, issued on Sept. 9, 1975, to the same inventor, includes a base receptacle mounted on a backpanel and having contact means therein which are in contact with the backpanel. The receptacle is adapted to receive the circuit package therein so that the terminal pads thereof are in alignment with the contact means provided in the receptacle. A cover is removably mounted in the receptacle and is laterally slidable relative thereto into and out of engagement with inclined plane members formed in the receptacle. When the cover is moved into engagement with the inclined plane members it will be deflected downwardly and locked in place to load the terminal pads of the circuit package into conductive contact with the contact means of the base receptacle. This connector, while constituting a substantial improvement in the art has some drawbacks, in that the wedging action provided by engagement of the cover with the inclined plane members is exerted only on three sides of the circuit package thus making it possible for unequal pressurization of the terminal pads on the fourth side of the circuit package to occur. Further, this prior art connector requires the usage of tooling to accomplish the required lateral sliding of the cover thereof.

In view of the foregoing, the need exists for a new and improved connector for leadless integrated circuit packages which overcomes some of the problems of the prior art.

SUMMARY OF THE INVENTION

In accordance with the present invention, a new and useful connector for leadless integrated circuit packages is disclosed which may be configured to accommodate various sizes and shapes of such packages, and may also be configured to employ any of several types of electrical interconnecting techniques so as to be compatible with the variety of printed circuit boards or wiring panels currently in use.

The connector of the present invention includes a base receptacle for mounting on the backpanel to which the integrated circuits are to be electrically coupled. The base receptacle is formed with a chamber therein for receiving the leadless package so that the terminal pads thereof align with contact means provided in the chamber of the base. The contact means extend from the chamber of the base and are adapted to be coupled to the backpanel in any manner suited to a particular type of backpanel, and electrical interconnection between the terminal pads of the leadless package and the contact means of the connector is accomplished by exerting a force on the leadless package to form a pressure connection therebetween. The force needed to form these pressure connections is provided by a demountable cover having a plurality of apertured inclined plane means formed in substantially equally spaced increments adjacent the periphery thereof so that when the cover is placed atop the base receptacle, upstanding stud means provided on the base will be received by the apertured inclined plane means and downward deflection of the cover to produce an evenly applied force vector on the integrated circuit package will result when the cover is slidingly moved relative to the base.

Accordingly, it is an object of the present invention to provide a new and useful connector for leadless integrated circuit packages.

Another object of the present invention is to provide a new and useful connector for leadless integrated circuit packages that may be configured to accommodate various sizes and shapes of such packages.

Another object of the present invention is to provide a new and useful connector for leadless integrated circuit packages that may be configured to be compatible with various types of backpanels.

Another object of the present invention is to provide a new and improved connector for leadless integrated circuit packages which produces an evenly distributed force to pressurize the terminal pads of the leadless package into conductive contact with contact means provided in the connector.

The foregoing and other objects of the present invention, as well as the invention itself, may be more fully understood from the following description when read in conjunction with the accompanying drawings.

BRIEF DESCRIPTION OF THE DRAWINGS

FIG. 2 is a plan view of the connector of the present invention.

FIg. 3 is an enlarged sectional view taken on the line 3—3 of FIG. 2.

FIG. 4 is an enlarged fragmentary isometric view of a portion of the cover of the connector of the present invention.

FIG. 4a is a view similar to FIG. 4 which illustrates a modification of the cover of the connector of the present invention.

FIG. 5 is an enlarged fragmentary sectional view similar to FIG. 3 showing a modification of the connector of the present invention.

DESCRIPTION OF THE PREFERRED EMBODIMENTS

Figure 1:
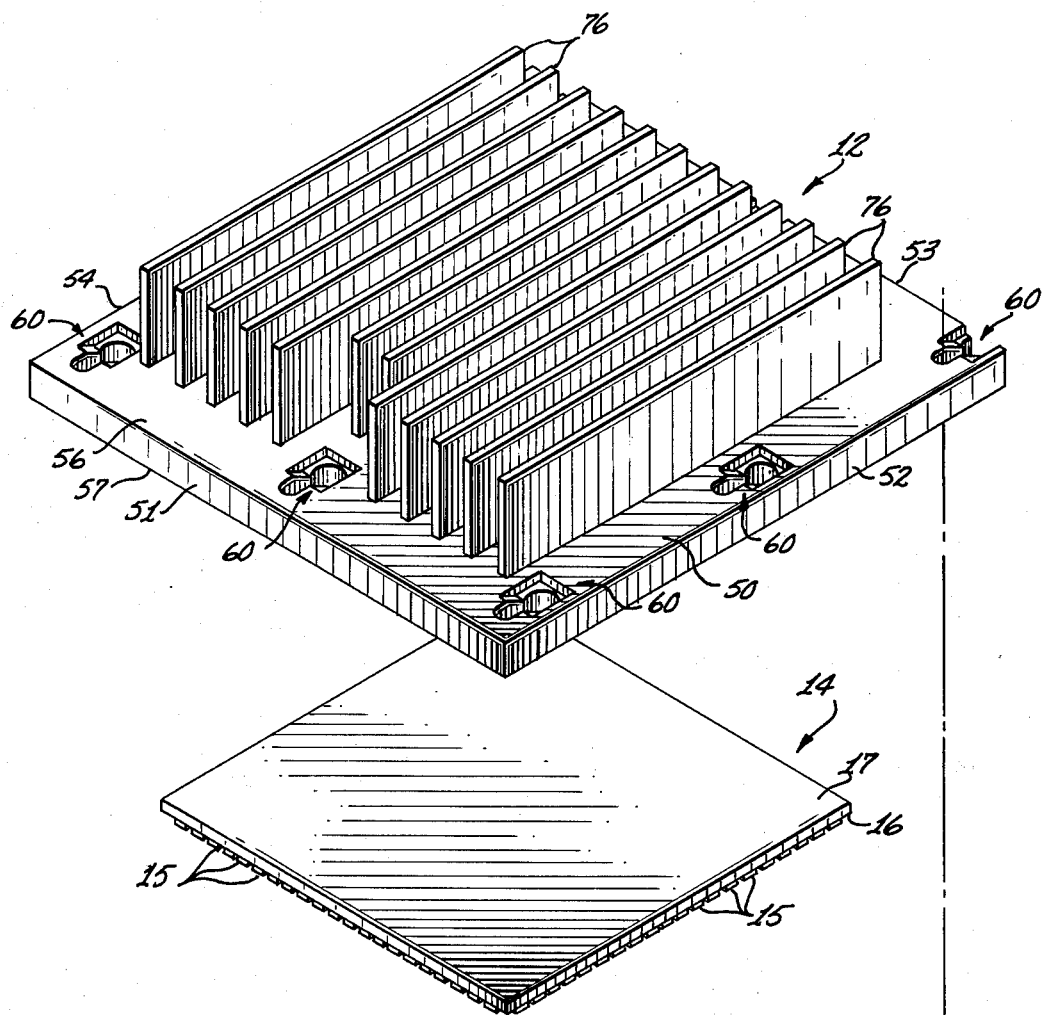
FIG. 1 is an exploded isometric view of the connector of the present invention illustrating the various features thereof.
Figure 1:
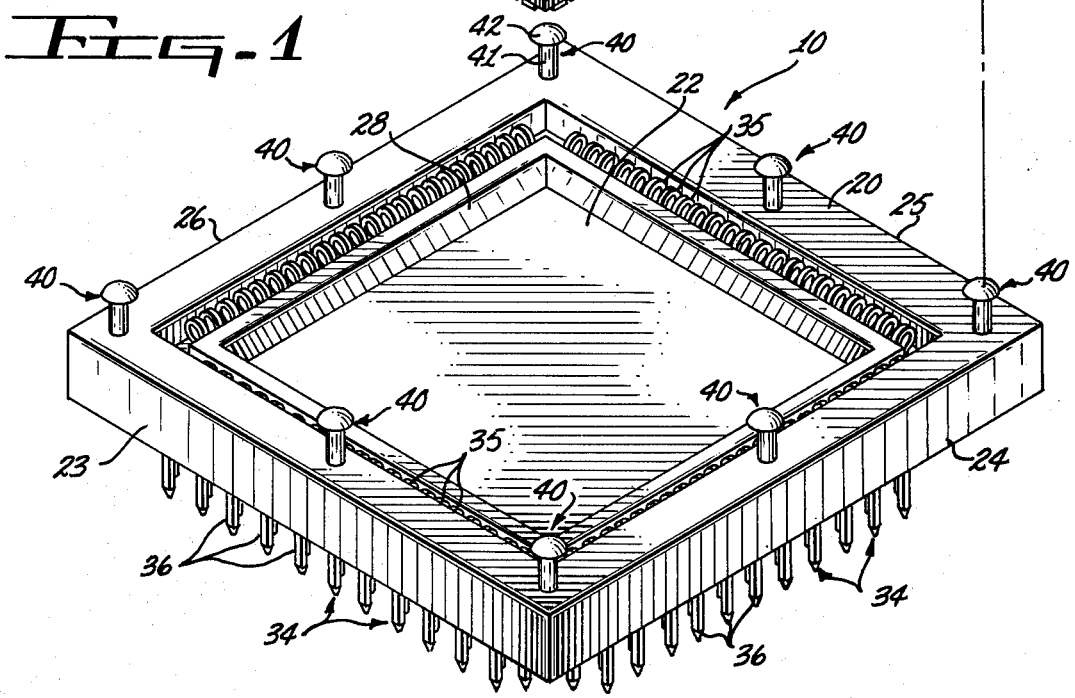

Referring more particularly to the drawings, FIG. 1 shows the connector of the present invention as including a base assembly 10 and a cover assembly 12 for mounting a leadless integrated circuit package 14 as will hereinafter be described in detail.

The leadless integrated circuit package 14 is of the type sometimes referred to as a face mounted 2 × 2 substrate with that name denoting the manner in which the package is to be mounted as well as the physical size and geometric configuration thereof. This type of package 14 is of square configuration having a dimension of 2 inches per side, and has a plurality of terminal pads 15 on one surface 16 of a planar substrate 17. The terminal pads 15 are positioned adjacent to at least one peripheral edge of the planar substrate 17 and are very often disposed adjacent all four peripheral edges thereof. Discrete integrated circuits (not shown) are mounted on the surface 16 of the substrate 17 and are electrically interconnected with the terminal pads 15 in a well known manner. In many instances, the package 14 is provided with a cover 18 (FIG. 3) for enclosing and protecting the discrete circuits (not shown).

It should be understood that the leadless integrated circuit package 14 is shown only for clarity and completeness of the disclosure and that other well known types of packages, such as dual-in-line leadless packages (not shown) would have served this purpose equally as well. It should therefore be apparent that the geometric configuration of the connector of the present invention, which is shown as being substantially square to accommodate the 2 × 2 substrate package 14, could just as easily be formed in a rectangular configuration to accommodate the usual rectangular shape of the dual-in-line leadless packages (not shown).

As seen best in FIGS. 1 and 3, the base assembly includes a housing 20 formed of suitable dielectric material such as polycarbonate, polypropylene and the like. As will become apparent as this description progresses, relatively large forces will exist when the terminal pads are pressure connected within the connector of the present invention, and therefore it is recommended that the material of which the housing 20 is fabricated be reinforced such as with glass fibers.

The housing 20 is shown as having a bottom 22 with upstanding side walls 23, 24, 25, and 26 with the bottom 22 and the side walls 23 through 26 of the housing 20 forming the enclosed bottom and perimeter of an upwardly opening chamber 28 provided within the housing. The chamber 28 formed in the housing 20 is configured to receive the leadless package 14 therein as will hereinafter be described in detail.

The base assembly 10 also includes means for electrically interconnecting the leadless package 14 with a suitable wiring board or backpanel 32 (FIG. 3). In this embodiment of the present invention, the electrical interconnecting means is shown to include a plurality of conductive elements 34 which are embedded in the bottom 22 of the housing 20 and each of which is formed with a spring contact portion 35 extending upwardly from the bottom 22 into the chamber 28 of the housing 20, and a pin portion 36 depending from the bottom 22 of the housing. The conductive elements 34 are formed of a suitable electrically conductive material such as phosphor bronze, beryllium copper, and the like, and may be of one piece construction or may be fabricated by suitably affixing the spring contact portions 35 to the pin portions 36.

The conductive elements 34 are arranged so as to match the spacing and the layout of the terminal pads 15 of the leadless package 14 so that when the package is placed within the chamber 28 of the housing 20, the terminal pads will be in vertical alignment with the spring contact portions 35 of the conductive elements. Therefore, to accommodate the leadless package 14 when that package has the terminal pads 15 thereof aligningly arranged adjacent each of the peripheral edges of its substrate 17, the conductive elements would be similarly aligningly arranged within the chamber 28 of the housing 20 adjacent each of the upstanding side and end walls 23-26 thereof. Likewise, if the package 24 has the terminal pads 15 thereof aligningly arranged adjacent to less than all of the peripheral edges of the substrate 17, the housing 20 need only be provided with a corresponding aligned arrangement of conductive elements 34. It should be apparent that the conductive elements 34 could be arranged within the chamber 28 of the housing 20 to accommodate virtually any array of terminal pads 15 provided on the surface 16 of the substrate 17 of the leadless package 14, such as plural parallel rows of terminal pads (not shown), staggered terminal pads (not shown), and the like.

The spring contact portions 35 of the conductive elements 34 are formed into substantially S-shaped members which are vertically compressible and will exert a counteracting force when attempts are made at such vertical compression. In this manner, when the terminal pads 15 are pressed downwardly, as will hereinafter be described in detail, a gastight conductive contact is formed between the terminal pads 15 and the aligned spring contact portions 35 of the conductive elements 34.

The pin portions 36 of the conductive elements 34 are in the form of the well known wire wrap pin, and as shown in FIG. 3, may be assembled to the backpanel 32 so as to protrude therethrough and thus expose the extending ends thereof for wire wrapping purposes as is well known in the art. Attachment of the pin portions 36 to the backpanel 32 may be accomplished in the well known manner of providing an interference fit within the pin apertures 38 formed in the backpanel. Alternately, the pin portions 36 may be solder connected to the backpanel 32 (not shown) which is another well known technique. In either event, affixing the pin portions 36 to the backpanel or wiring panel 32 will also serve to mount the base assembly 10 thereto.

As hereinbefore mentioned, electrical interconnection of the terminal pads 15 of the package 14 with the spring contact portions 35 of the conductive elements 34 is made by a pressure connection. In the connector of the present invention, the force necessary to achieve such a pressure connection is derived from the manner in which the cover assembly 12 is mounted to the base assembly 10.

Toward this end, a plurality of upstanding stud means 40 are mounted, as will hereinafter be described, in the housing 20 of the base assembly 10. The studs 40 extend normally from the side walls 23-26 of the housing 20 and are arranged in substantially equally spaced increments about the chamber 28 thereof. In the preferred embodiment, the studs 40 are eight in number, with different ones of those studs being located at each corner of the housing and intermediate the ends of each side wall 23-26 of the housing.

Each of the stud means 40 is provided with a shank 41 having an enlarged head 42 on the upper end, and the studs may be affixed to the housing in any suitable manner, such as by being molded therein. If such a method of affixation is employed, the studs 40 may be provided with annular protrusions 43 (FIG. 3) on the shank 41 which serve as anchors to prevent the studs from being pulled out of the housing. An alternate form of stud and mounting means is shown in FIG. 5 wherein a typical one of said studs is shown. In this embodiment, the shank 41 is provided with threads 44 on the lower end thereof for threadingly engaging a captive nut 45 suitably carried in the housing.

In either case, the stud means 40 are each configured to provide a shoulder 46 on the downwardly facing surface of the enlarged head 42, with those shoulders serving as cover deflecting and retaining means as will hereinafter be described in detail.

The cover 12 comprises a body 50 which is a planar structure configured to mount atop the base assembly 10, and thus may be formed in a geometric shape and size which substantially matches that of the base housing 20, with the exception of the thickness dimension. In the illustrated embodiment, the cover body 50 is a substantially square structure having side edges 51, 52, 53, and 54, and having an upper planar surface 56 and a lower planar surface 57.

A plurality of apertured inclined plane means 60 are formed in the cover body 50 with there being one of those apertured inclined plane means for each of the stud means 40 of the base housing 20. Thus, in the preferred embodiment, the apertured inclined plane means 60 are eight in number with different ones thereof being located at each corner of the cover 12 and midway between the ends of each side edge 51-54 of the cover.

Each of the apertured inclined plane means 60 includes a special surface configuration formed in the cover body 50 which, as seen best in FIG. 4, comprises a lower surface 62, an upper surface 63 which is laterally spaced from the lower surface, and an inclined plane surface 64 or ramp which extends between the lower surface 62 and the upper surface 63. As seen, the lower surface 62 is provided by forming a cavity 65 which is recessed below the upper planar surface 56 of the cover 12, and that the upper surface 63 is actually a portion of the upper planar surface 56 of the cover body 50. However, although that particular arrangement is preferred, FIG. 4a illustrates another method of accomplishing the same objective. In the modification shown in FIG. 4a, the lower surface 62 is actually a portion of the upper planar surface 56 of the cover body 50, and the upper surface 63 is provided by molding or otherwise forming a pedestal 68 on the cover body 50 with the upper surface 63 being the top of the pedestal, and the inclined plane surface 64 forming one side thereof.

In either case, each of the apertured inclined plane means 60, further comprises a keyhole shaped aperture formed through the cover body 50, with the aperture including an enlarged portion 70 and a laterally extending narrowed slot 72. The enlarged portions 70 of the keyhole apertures open upwardly onto the lower surface 62 and are sized to be somewhat larger than the heads 42 of the upstanding studs 40 so that when the cover 12 is placed atop the base housing 20, the upstanding studs 40 will each enter into an aligned one of those enlarged portions 70, with the heads 42 of the studs 40 being disposed above the lower surface 62 formed on the cover 12. The narrowed slots 72 of the keyhole apertures each open upwardly onto the inclined plane surface 64 and onto the upper surface 63, and each have a width dimension which is somewhat larger than the diameter of the shanks 41 of the stud means 40 to permit lateral sliding of the cover 12 relative to the base assembly 10 as will hereinafter be described in detail.

As best seen in FIG. 2, the narrowed slots 72 of each of the keyhole apertures extend in the same direction, i.e., extend toward side edge 51 of the cover body 50. Thus, when the cover 12 is placed atop the base assembly 10, stud means 40 will enter into the aligned apertured inclined plane means 60 by passing upwardly in the enlarged portions 70. Such placement of the cover 12 on the base assembly 10 will locate the enlarged heads 42 of the studs 40 above the lower surfaces 62 of the apertured inclined plane means 60. In that state, the cover 12 will rest lightly on the substrate 17 of the circuit package 14, and will be laterally offset with respect to the base 10, as shown in dotted lines 74 in FIG. 2. Lateral sliding movement of the cover 12 in the direction of the arrow 75 (FIG. 2) will move the keyhole apertures relative to the stud means 40 so that the narrowed slots 72 are moved into a straddling position relative to the shanks 41 of the studs 40. Such movement will bring the inclined plane surfaces 64 into wedged engagement with the shoulders 46 of the studs 40, and thereby cause downward deflection of the cover 12. Such downward cover deflection will move the terminal pads 15 of the circuit package 14 into pressurized conductive contact with the spring elements 35 of the conductive elements 34 formed in the base assembly 10. When the inclined plane surfaces 64 of the apertured inclined plane means 60 have passed completely beneath the heads 42 of the studs 40, the shoulders 46 will bear against the upper surfaces 63 and thus, the cover will be lockingly held in the downwardly deflected position.

It should be noted that the inclined plane surfaces 64 should be configured with a length to height ratio of at least 3:1, and preferably 5:1, to provide a mechanical advantage that is high enough to facilitate lateral sliding movement of the cover 12.

Removal of the cover body 50 such as could be required for servicing and replacement of the leadless package 14, is accomplished by simply laterally moving the cover assembly in the direction opposite to that indicated by the arrow 75 (FIG. 2), such action will reverse the movements hereinbefore described with reference to the mounting of the cover assembly 12 on the base assembly 10, and when such movements have been completed the cover may be lifted from the base assembly.

As is well known in the art integrated circuit packages are capable of generating a considerable amount of heat while operating, and this heat can destroy such packages in the absence of means for dissipation thereof. Therefore, the cover body 50 may be provided with heat conducting and radiating means in the form of a plurality of fin pairs 76 such as of copper or other suitable heat conductive material.

Each fin pair 76 is an elongated structure of U-shaped in cross section configuration with the two individual upstanding fin members 77 interconnected at the lower ends thereof with a bight member 78. The cover body 50 is formed with a cavity 79 in the bottom surface thereof and a plurality of elongated slots 80 extending from the cavity 79 upwardly through the upper planar surface 56 of the cover body 50. The fin pairs 76 are assembled to the cover body 50 by inserting the upstanding fins 77 into the slots 80 to position the bight members 78 within the cavity 79 of the cover body. A resilient body 81 may be interposed between the fin pairs and the cover so that when the cover assembly 12 is mounted on the base assembly 10, the bight members 78 of each of the fin pairs 76 will be loaded into engagement with the planar substrate 17 of the circuit package 14 for an effective transfer of heat.

It is contemplated that assembly of the circuit package 14 within the connector of the present invention will include the application of a silicone grease (not shown) between the circuit package 14 and the cover body 50. As is well known in the art, silicone grease is a good heat conductor and will therefore enhance heat transfer between the package 14 and the fin pairs 76. Also, the presence of silicone grease (not shown) between the circuit package 14 and the cover body 50 will aid the sliding movement employed to mount the cover body 50 on the housing body 20 as hereinbefore described.

Reference is now made to FIG. 5 wherein an alternate form of the electrical interconnecting means is shown as being mounted in the base assembly 10 and is employed for electrically interconnecting the leadless package 14 with a backpanel which in this instance is in the form of a printed circuit board 84 having the usual mounting pads 85 thereon. In this embodiment of the present invention, the electrical interconnecting means includes one conductive element 94 for each electrical interconnection to be made. Each of the conductive elements includes an upwardly facing spring contact portion 95 and a downwardly facing spring contact portion 96. The spring contact portions 95 and 96 are formed with an integral connecting portion which is embedded within the base housing 20. When the base assembly 10 is mounted on the backpanel 84 such as with the screws 91, which engage captive nuts 92 held within the base assembly, and the cover assembly 12 is mounted on the housing 20 as previously described, pressure interconnections with the terminal pads 15 of the package 14 and the mounting pads 85 of the backpanel 84 will be made as previously described.

While the principles of the invention have now been made clear in an illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. A connector for removably mounting a leadless circuit package of planar configuration on a backpanel and electrically coupling the terminal pads of the leadless circuit package to the backpanel, said connector comprising:
   a. a housing for mounting on the backpanel, said housing having endless upstanding side walls which form the perimeter of an upwardly opening chamber into which the leadless circuit package is nestingly positionable with a planar surface thereof disposed to extend above the side walls of said housing;
   b. electrical interconnecting means mounted in said housing and extending into the chamber thereof for engaging the terminal pads of the leadless circuit package when that package is positioned therein, said electrical interconnecting means extending from said housing for engaging the backpanel when said housing is mounted thereon;

c. a plurality of stud means mounted on said housing in substantially evenly spaced increments so as to be upstanding from each of the side walls thereof in an array which surrounds the cavity of said housing; and d. a cover positionable above said housing in overlaying relationship with respect to the side walls thereof and in contiguous engagement with the extending planar surface of the leadless circuit package when that package is positioned in the chamber of said housing, said cover being laterally and downwardly movable relative to said housing for exerting a downwardly directed force on the leadless circuit package when that package is positioned in the chamber of said housing, said cover having a plurality of apertured inclined plane means formed therein for receiving said stud means when said cover is positioned above said housing and which move into engagement with said stud means upon lateral movement of said cover to cause downward deflection thereof.

2. A connector as claimed in claim 1 wherein said plurality of apertured inclined plane means formed in said cover each comprise:
   a. a lower surface formed on said cover;
   b. an upper surface formed on said cover and laterally spaced from said lower surface;
   c. an inclined plane surface extending angularly between said lower surface and said upper surface; and
   d. said cover having a keyhole shaped aperture formed therethrough, said aperture having an enlarged portion which opens upwardly onto said lower surface and having a narrowed slot which opens upwardly onto said inclined plane surface and onto said upper surface.

3. A connector as claimed in claim 1 wherein said plurality of apertured inclined plane means formed in said cover each comprise:
   a. a lower surface forming the bottom of a recessed cavity provided in the upper planar surface of said cover;
   b. an inclined plane surface formed in said cover so as to extend laterally angularly and upwardly from said lower surface to the upper planar surface of said cover; and
   c. said cover having a keyhole shaped aperture formed therethrough, said aperture having an enlarged portion which opens upwardly onto said lower surface and having a narrowed slot which opens upwardly onto said inclined plane surface and onto the upper planar surface of said cover.

4. A connector as claimed in claim 1 wherein said plurality of apertured inclined plane means formed in said cover each comprise:
   a. an upstanding pedestal formed on said cover and having an upper surface;
   b. an inclined plane surface forming one side of said pedestal, said inclined plane surface extending laterally angularly and downward from the upper surface of said pedestal to the upper planar surface of said cover; and
   c. said cover having a keyhole shaped aperture formed therethrough, said aperture having an enlarged portion which opens upwardly onto the upper planar surface of said cover adjacent said inclined plane surface and having a narrowed slot which opens upwardly onto said inclined plane surface and onto the upper surface of said pedestal.

5. A connector as claimed in claim 1 wherein each of said plurality of stud means comprises:
   a. a shank portion affixed to said housing and upstanding therefrom; and
   b. an enlarged head on the upwardly extending end of said shank.

* * * * *